(12) United States Patent
Numakura et al.

(10) Patent No.: US 6,391,473 B2
(45) Date of Patent: May 21, 2002

(54) CU PLATED CERAMIC SUBSTRATE AND A METHOD OF MANUFACTURING THE SAME

(75) Inventors: Iwao Numakura, Tama; Noriaki Tsukada, Hachioji, both of (JP)

(73) Assignee: Yamatoya & Co., Ltd., Tokyo (JP)

( * ) Notice: Subject to any disclaimer, the term of this patent is extended or adjusted under 35 U.S.C. 154(b) by 0 days.

(21) Appl. No.: 09/833,162

(22) Filed: Apr. 11, 2001

(30) Foreign Application Priority Data

Apr. 27, 2000 (JP) ........................................ 2000-127600
Jan. 11, 2001 (JP) ........................................ 2001-003865

(51) Int. Cl.[7] .............................. B32B 15/04; B05D 3/00
(52) U.S. Cl. ..................... 428/627; 427/305; 427/404; 428/620; 428/656; 428/660; 428/663; 428/664; 428/665; 428/666; 428/667; 428/668; 428/672; 428/273; 428/674; 428/680; 428/935; 428/936; 428/938; 428/433; 428/630
(58) Field of Search .................. 428/620, 627, 428/656, 660, 663, 664, 665, 666, 667, 668, 672, 673, 674, 680, 935, 936, 938, 433, 630; 427/305, 404

(56) References Cited

U.S. PATENT DOCUMENTS 4,604,299 A * 8/1986 De Luca et al. ............. 427/305
4,891,259 A * 1/1990 Moran ......................... 428/620

* cited by examiner

*Primary Examiner*—Robert R. Koehler
(74) *Attorney, Agent, or Firm*—McKee, Voorhees & Sease, P.L.C.

(57) ABSTRACT

A Cu plated ceramic substrate is used in a semiconductor. On a ceramic substrate layer, a thin-film Cr layer is put, and a thin-firm Au layer is put on the Cr layer. The Au layer is plated with Cu. By providing the Au and Cr layers between the ceramic plate and Cu layer, adhesibility is increased. A Pertier element which includes the Cu plated ceramic layer is employed in a semiconductor to absorb and generate heat efficiently.

11 Claims, 2 Drawing Sheets

CU PLATED CERAMIC SUBSTRATE AND A METHOD OF MANUFACTURING THE SAME

BACKGROUND OF THE INVENTION

The present invention relates to a Cu plated ceramic substrate, a Pertier element to which the substrate is applied, and a method of manufacturing the substrate.

Cu plated materials are widely used in industrial fields. For example, in Cu plating solution, CuCN plating solution and copper pyrophosphate plating solution, a direct current is applied between Cu as anode and a workpiece as cathode to precipitate Cu on the workpiece, or Cu precipitated workpiece is made using electroless Cu plating solution.

The workpiece made of ceramic substrate is called Cu plated ceramic substrate, and the workpiece made of plastics is called a Cu plated plastic substrate.

Cu plated ceramic substrates are used as electronic parts such as semiconductor devices, small communication devices, relays, chip carriers and Pertier elements.

The surface of ceramics is treated with acid, sand blasts, etc. and is subjected to electroless Cu plating. Thereafter, Cu electroplating is applied. Alternatively, after another metal is applied on ceramic substrates with dry thin film process such as vapor deposition, Cu plating is applied. As another metal, Co, Nb, Ta, Ti, Cu—Ni—Cr alloy, Mo or W is used.

The following are known to manufacture a Cu plated ceramic substrate:

① Cu film or plate is directly joined on a ceramic substrate as described in J. Am. Ceram. Soc. 61, 1978 by A. K. Varchneya and R. J. Petti.

② Paste of conductive material such as Ag, Au, Cu and Ni is applied on a ceramic substrate by printing or other methods, and plating is applied thereon, or after firing at several hundred degree, plating is applied.

However, diameter of Cu particle precipitated by electroless copper plating is large, so that contact area between the Cu particle and irregular portions of the surface of the ceramic substrate is small. Anchoring effect is poor, and adhesibility between the Cu particle and the ceramic substrate is low.

Furthermore, the precipitated particles are large, and a recess becomes a space, to which treating chemicals are attached to decrease adhesibility.

In the latter, conductive paste is employed, and a diameter of a particle is as large as electroless Cu plating by twenty to thirty times, so that contact area becomes very small between the particle of the conductive material and ceramic substrate to lead poor anchoring effect and decreasing adhesibility.

A Pertier element comprises a module using Pertier effect which is exothermic or endothermic phenomenon except Joule heat at a contacting point of different conductors or semi-conductors when an electric current is applied to the point and which was found by J. C. A. Pertier in 1834.

The Pertier element is employed as a cooler for a semiconductor laser device used for optical communication. The semiconductor laser converts an optical signal by a wave length converter to a shape to which WDM (Wavelength Division Multiplexing) can be made to transmit it via an optical fiber The signal in which wavelength division is multiplexed passes through the optical fiber, and is converted to the original optical signal by a wave length converter. A number of signals can be treated as a single signal and thus transmitted by a single optical fiber, thereby reducing the number of the optical fibers significantly.

The Pertier element is employed to cool a semiconductor laser device for optical communication. The narrower the range of w temperature for controlling wavelength of a signal for converting WDM becomes, the smaller a semiconductor device becomes. Thus, the Pertier element used therein becomes smaller, and it is difficult to make such an element by attaching known copper plates. Adhesive strength of the Pertier element made by such attachment needs a larger total area. Miniaturization of the element is limited.

To overcome such problem, plating must be used with photo-forming. With miniaturization, adhesive area between the ceramic substrate and conductor circuit significantly decreases, and it is very important to improve adhesive strength between them.

The Cu plated ceramic substrate according to the present invention is suitably used as substrate for the Pertier element for cooling a miniaturized semiconductor laser.

There are two known types of Pertier elements, one being a Cu plate or film which is punched by a press and bonded to a ceramic substrate, the other being a conductive paste which is applied to a ceramic substrate, a Cu plating being applied after firing of the substrate.

However, there are disadvantages in the known Pertier substrates. In the former, miniaturization is impossible, and organic compounds must be inserted as adhesive to lead low thermal conductivity and high consumption power which is expensive. In the latter, owing to particle diameter of the conductive paste, it provides low bonding strength with the ceramic substrate and low reliability. In both elements, owing to insertion of organic compounds, the compounds deteriorate to decrease bonding strength.

SUMMARY OF THE INVENTION

In view of the disadvantages in the prior art, it is an object of the present invention to provide a Cu plated ceramic substrate to increase adhesibility between a ceramic substrate and a Cu plating layer.

To achieve the object, according to one aspect of the present invention, there is provided a Cu plated ceramic substrate which comprises:

a ceramic substrate layer;

a dry thin-film Cr layer on the ceramic substrate layer;

a dry thin-film Au layer on the thin-film Cr layer; and a Cu plating layer on the thin-film Au layer.

According to another aspect of the present invention, there is provided a method of manufacturing a Cu plated ceramic substrate, comprising the steps of:

forming a dry thin-film Cr layer on a ceramic substrate layer;

forming a dry thin-film Au layer on the thin-film Cr layer; and plating the thin-film Au layer with Cu.

BRIEF DESCRIPTION OF THE DRAWINGS

The features and advantages of the invention will become more apparent from the following description with respect to embodiments as shown in the appended drawings wherein.

DETAILED DESCRIPTION OF PREFERRED EMBODIMENTS

Figure 1:
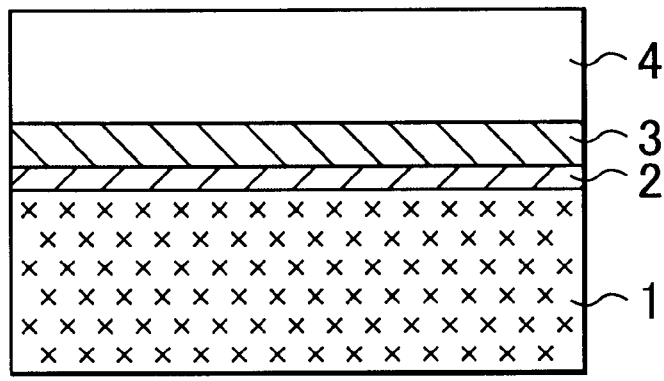
FIG. 1 is an enlarged sectional view of the first embodiment of a Cu plated ceramic substrate according to the present invention.

FIG. 1 is a sectional view of the first embodiment of a Cu plated ceramic substrate according to the present invention. On one side of ceramic substrate layer 1, a dry thin film Cr layer 2, a dry thin film Au layer 3 and a Cu plating layer 4 are formed.

To overcome the foregoing disadvantages in the prior art, the dry thin-film Cr layer is applied on the ceramic substrate layer. By forming the dry thin-film Cr layer on the ceramic substrate layer by metal vapor deposition, Cr becomes fine particles to increase contact area with irregular surface of the ceramic substrate layer to increase anchoring effect, thereby improving adhesibility between the Cr particles and the ceramic substrate layer.

The Cr layer is formed by dry thin-film method, thereby avoiding corrosion by the Cr particles in known methods using chemical agents.

However, it is difficult to apply Cu plating directly on the dry thin-film Cr layer because Cr which provides high hydrophilicity resists Cu which provides high lipophilicity to decrease adhesibility. Further, Cr is oxidized by $O_2$ in air to put oxides between the Cr and Cu to decrease adhesibility.

In view of the features of the dry thin-film Cr layer, the inventors studied very hard, and found it very efficient to form the dry thin-film Au layer on the dry thin-film Cr layer.

To apply the dry thin-film Au layer on the dry thin-film Cr layer provides the following advantages. Au is a very stable metal which is never oxidized in air, does not form impurities which decrease adhesibility with Cu precipitated in the next Cu plating step, and diffuses into Cu at boundary of Au and Cu to increase anchoring effect and adhesibility.

It is very important to provide Au which contacts Cu in the present invention.

In the present invention, instead of the dry thin-film Au layer directly formed on the dry thin-film Cr layer on the ceramic substrate layer, another dry thin-film metal layer may be formed on the dry thin-film Cr layer, and the dry thin-film Au layer may be formed thereon. As another metal layer, Ni, Mo, W, Ti or Ag may be employed to apply a thin-film manufacturing process. In the present invention, the dry thin-film of Cr, Au etc. may be made by ordinary methods such as vacuum deposition, cathode sputtering and chemical vapor deposition (CVD).

Figure 2:
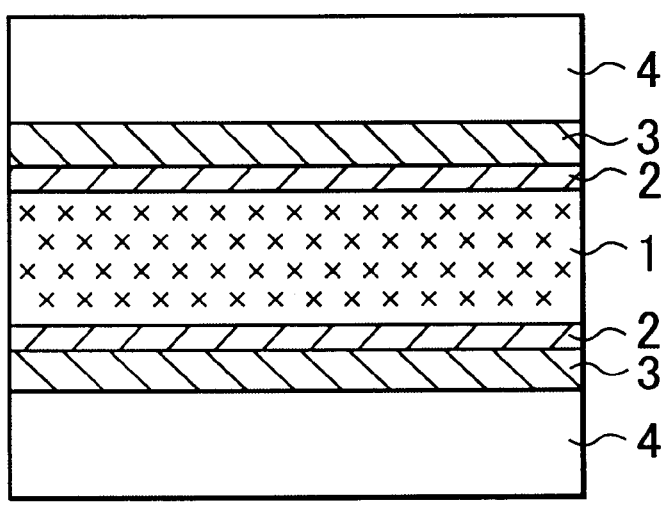
FIG. 2 is an enlarged sectional view of the second embodiment of a Cu plated ceramic substrate according to the present invention.

FIG. 2 is a sectional view of the second embodiment of a Cu plated ceramic substrate according to the present invention. On both sides of a ceramic substrate layer 1, a dry thin film Cr layer 2, a dry thin film Au layer 3 and a Cu plating layer 4 are formed.

To prevent oxidation of the outermost Cu surface, one or combination of known methods such as Ni plating, Au plating, soft soldering and Sn—Sb plating may be applied, or the surface may be covered with organic compounds.

Figure 3:
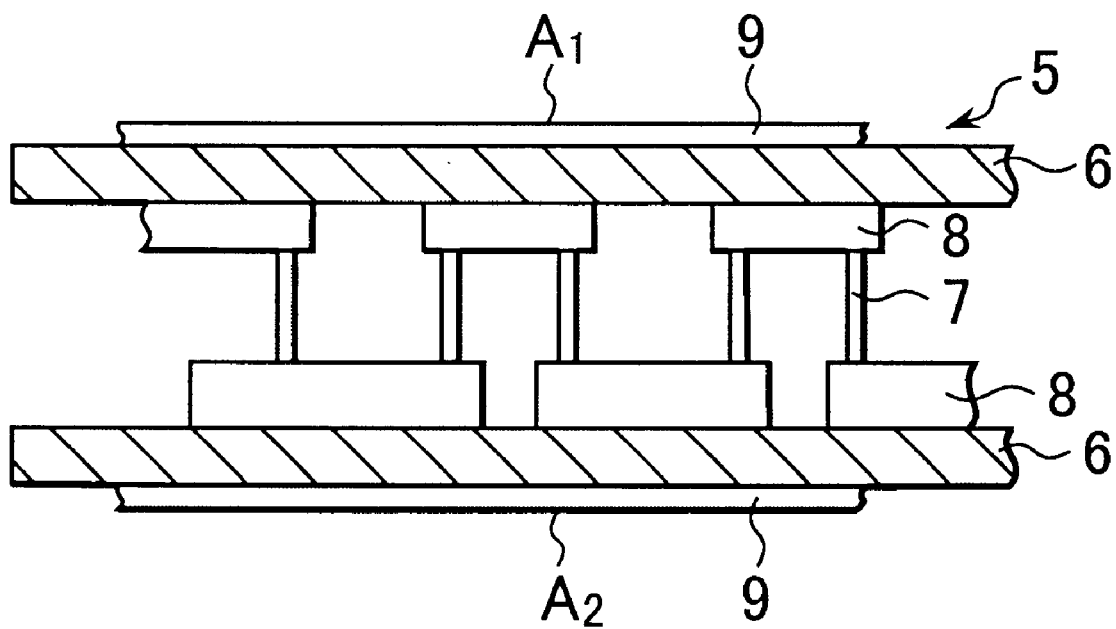
FIG. 3 is an enlarged sectional view of a Pertier element to which the Cu plated ceramic substrate according to the present invention is applied.

FIG. 3 is a schematic sectional view of a Pertier element 5 to which the Cu plated ceramic substrate 6 thus made as above is applied.

A semiconductor 7 is mounted at the ends to inner conducting circuits 8,8, which are connected to the Cu ceramic substrates 6,6 according to the present invention respectively. Outer conducting circuits 9,9 are provided on the Cu plated ceramic substrates 6,6. The Cu plated ceramic substrate 6 is mounted to the inner conducting circuit 8, and the Cu plating layer 4 is mounted to the outer conducting circuits 9. Between a ceramic substrate layer and a Cu plating layer of the Cu plated ceramic substrates 6, a thin-film Cr layer and a thin-film Au layer are provided, thereby forming tightly adhesive structure. The outer conducting circuits 9,9 form an endothermic side $A_1$ and an exothermic side $A_2$. An electric current is applied to the semiconductor 7 to result in generating endothermic reaction at one side and exothermic reaction at the other side, which are transmitted to the outside via $A_1$ and $A_2$. The Cu plated ceramic substrate in FIG. 2 may be employed.

According to the Cu plated ceramic substrate, no organic compounds are inserted in the ceramic substrate, metal atoms are strongly anchored on the ceramic substrate as mentioned above, and the thin film Au layer and Cu are strongly bonded by plating, and owing to Au diffusion, the thin film Au layer is strongly adhered to the Cu plating layer. It provides high bonding strength with the ceramic substrate and no organic compounds to achieve good thermal conductivity. It can be manufactured by plating and photo-forming, thereby allowing it possible to manufacture a fine Cu plated ceramic substrate. Therefore, the Cu plated ceramic substrate according to the present invention is convenient as a substrate for Pertier element which attains both cooling and heating.

EXAMPLES

Examples according to the present invention will be described as below. $Al_2O_3$, AlN or SiC was used as ceramic substrate, and the surface of each ceramic substrate was cleaned by a ultrasonic cleaning machine and dried by hot wind of a clean bench.

Then, to apply chemical vapor deposition of a dry thin film manufacturing process, the cleaned ceramic substrate was put into a furnace of a vacuum vapor deposition machine, and Cr and Au were evaporated to form films to a determined thickness respectively while degree of vacuum is 1Pa±10% at temperature of 310±5° C. Cr—Au thin film ceramic substrates before Cu plating were made. Cr—Ni—Au thin film ceramic substrates were made as well.

Thus, electroless copper plating was made using electroless cooper plating solution of Work Metal Co., Ltd. at liquid temperature of 70±2° C., and copper electroplating was made at temperature of 25±1° C. using $CuSO_4$ of Adtech Japan Co., Ltd. By combination of the two methods, Cu plating layer of a determined thickness was made.

Peel or bonding strength was determined with respect to Cu plated ceramic substrates thus made, using AGS-50B of Shimazu Mfg., Co., Ltd.

The results are shown in Tables 1 to 3. Table 3 shows Ni thin-film layer between thin-film Cr and Au layers. The larger the numbers are, the higher bonding strength is.

TABLE 1

| Ceramic Substrate | Cr layer Thickness (Å) | Au layer Thickness (Å) | Cu layer Thickness (μm) | Peel Strength (kg/mm²) |
|---|---|---|---|---|
| $Al_2O_3$ | 1500 | 1500 | 35 | 0.793 |
|  | 1000 | 1500 | 35 | 0.820 |
|  | 1500 | 1000 | 35 | 0.585 |
|  | 1000 | 1000 | 35 | 0.679 |
| AlN | 1500 | 1500 | 35 | 0.857 |
|  | 1000 | 1500 | 35 | 0.845 |

TABLE 1-continued

| Ceramic Substrate | Cr layer Thickness (Å) | Au layer Thickness (Å) | Cu layer Thickness ($\mu$m) | Peel Strength (kg/mm$^2$) |
|---|---|---|---|---|
| | 1500 | 1000 | 35 | 0.712 |
| | 1000 | 1000 | 35 | 0.722 |
| SiC | 1500 | 1500 | 35 | 0.767 |
| | 1000 | 1000 | 35 | 0.802 |

TABLE 2

| Ceramic Substrate | Cr layer Thickness (Å) | Au layer Thickness (Å) | Electroless Cu layer Thickness ($\mu$m) | Cu electro-plating thickness ($\mu$m) | Peel Strength (kg/mm$^2$) |
|---|---|---|---|---|---|
| Al$_2$O$_3$ | 1500 | 1500 | 0.3 | 35 | 0.745 |
| | 1000 | 1500 | 0.3 | 35 | 0.760 |
| | 1500 | 1000 | 0.3 | 35 | 0.642 |
| | 1000 | 1000 | 0.3 | 35 | 0.631 |

TABLE 3

| Ceramic Substrate | Cr layer Thickness (Å) | Ni layer Thickness (Å) | Electroless Au layer Thickness ($\mu$m) | Cu electro-plating thickness ($\mu$m) | Peel Strength (kg/mm$^2$) |
|---|---|---|---|---|---|
| Al$_2$O$_3$ | 1500 | 1500 | 1500 | 35 | 0.830 |
| | 1000 | 1500 | 1500 | 35 | 0.798 |
| | 1500 | 1500 | 1000 | 35 | 0.721 |
| | 1000 | 1500 | 1000 | 35 | 0.732 |

COMPARATIVE EXAMPLES

A ceramic substrate is immersed in NaOH to roughen the surface, and cleaned by ultrasonic cleaning. Electroless copper plating and copper electroplating are made.

Cr vapor deposited samples before electroless copper plating were manufactured.

TABLE 4

| Ceramic Substrate | Cr layer Thickness (Å) | Electroless Cu layer Thickness ($\mu$m) | Cu electro-plating thickness ($\mu$m) | Peel strength (kg/mm$^2$) |
|---|---|---|---|---|
| Al$_2$O$_3$ | none | 0.3 | 35 | 0.145 |
| | none | 0.5 | 35 | 0.135 |
| | none | 0.8 | 35 | 0.152 |
| | 1500 | 0.3 | 35 | 0.381 |
| | 1000 | 0.3 | 35 | 0.364 |

The Cu plated ceramic substrate according to the present invention formed a thin-film Cr layer on the ceramic substrate and an Au thin-film layer on the Cr thin-film layer, thereby achieving bonding strength of about 2.5 to 5.0 times as large as the prior methods.

Especially, if the Pertier element includes the substrate, the Cu plated ceramic substrate according to the present invention will meet with the requirements of bonding strength of over 0.400 kg/mm$^2$.

The foregoing merely relate to embodiments of the invention. Various changes and modifications may be made by persons skilled in the art without departing from the scope of claims wherein:

What is claimed is:

1. A Cu plated ceramic substrate which comprises:
   a ceramic substrate layer;
   a dry thin-film Cr layer on the ceramic substrate layer;
   a dry thin-film Au layer on the thin-film Cr layer; and
   a Cu plating layer on the thin-film Au layer.

2. A substrate as claimed in claim 1 wherein the ceramic substrate layer is made of a ceramic which is selected from the group which consists of Al$_2$O$_3$, AlN and SiC.

3. A substrate as claimed in claim 1 wherein a metal which is selected from the group consisting of Ni, Mo, W, Ti and Ag is put between the thin-film, Cr and Au layers.

4. A substrate as claimed in claim 1 wherein the Cu plating layer is made by electroless or electro plating.

5. A substrate as claimed in claim 1 wherein on both sides of the ceramic substrate layer, the thin-film Cr layer, the thin-film Au layer and the Cu plating layer are formed respectively.

6. A Pertier element which includes the Cu plated ceramic substrate as claimed in claim 1, a conductor and/or a semiconductor.

7. A method of manufacturing a Cu plated ceramic substrate, comprising the steps of:
   forming a dry thin-film Cr layer on a ceramic substrate layer;
   forming a dry thin-film Au layer on the dry thin-film Cr layer; and
   plating the thin-film Au layer with Cu.

8. A method as claimed in claim 7 wherein the ceramic substrate layer is made of a ceramic which is selected from the group of Al$_2$O$_3$, AlN and SiC.

9. A method as claimed in claim 7 wherein a metal which is selected from the group consisting of Ni, Mo W, Ti and Ag is put between the thin-film Cr and Au layers.

10. A method as claimed in claim 7 wherein the step of plating Au layer comprises electro or electroless Cu plating.

11. A method as claimed in claim 7 wherein the Cr and Au layers are formed by vacuum deposition, cathode spattering or chemical vapor deposition.

* * * * *